United States Patent
Sato et al.

(10) Patent No.: US 6,845,920 B2
(45) Date of Patent: Jan. 25, 2005

(54) PIEZOELECTRIC ELEMENT AND INJECTOR USING THE SAME

(75) Inventors: Kazuhide Sato, Ama-gun (JP); Ryonosuke Tera, Oobu (JP); Naoyuki Kawazoe, Hashima (JP)

(73) Assignee: Denso Corporation (JP)

( * ) Notice: Subject to any disclaimer, the term of this patent is extended or adjusted under 35 U.S.C. 154(b) by 52 days.

(21) Appl. No.: 10/122,237

(22) Filed: Apr. 16, 2002

(65) Prior Publication Data

US 2002/0153431 A1 Oct. 24, 2002

(30) Foreign Application Priority Data

Apr. 19, 2001 (JP) ........................................ 2001-121440

(51) Int. Cl.⁷ ................................................ B05B 1/08
(52) U.S. Cl. .............................. 239/102.1; 239/102.2; 310/328; 310/331
(58) Field of Search ........................... 239/102.1, 102.2; 310/328, 331, 359, 366; 361/321.4

(56) References Cited

U.S. PATENT DOCUMENTS 4,887,186 A * 12/1989 Takeda et al. ............ 361/321.4
5,677,717 A * 10/1997 Ohashi ........................ 347/69

FOREIGN PATENT DOCUMENTS

| JP | 62-88382 | 4/1987 |
| JP | 130970 | 5/1990 |
| JP | 3-12974 | 1/1991 |
| JP | 3-155180 | 7/1991 |
| JP | 4-279070 | 10/1992 |

* cited by examiner

*Primary Examiner*—Robin O. Evans
(74) *Attorney, Agent, or Firm*—Nixon & Vanderhye PC

(57) ABSTRACT

A piezoelectric element and an injector using the same piezoelectric element are disclosed, which are so high in reliability as not to be shorted even in a high humidity environment, are small in size, are low in cost and are high in heat radiation capability. The piezoelectric element comprises a ceramic laminate (10) including a plurality of ceramic layers of a piezoelectric ceramic (11) and a plurality of internal electrode layers (21, 22), stacked alternately. At least an organic insulating layer (41) of an organic material is formed on at least a part of the surface of the ceramic laminate (10), and at least an inorganic insulating layer (42) of an inorganic material is formed on the organic insulating layer (41).

14 Claims, 10 Drawing Sheets

PIEZOELECTRIC ELEMENT AND INJECTOR USING THE SAME

BACKGROUND OF THE INVENTION

1. Field of the Invention

The present invention relates to a piezoelectric element used for a piezoelectric actuator and an injector using the piezoelectric element.

2. Description of the Related Art

In recent years, the piezoelectric element used as a piezoelectric actuator has begun to employ a laminated structure generally comprising 100 to 700 piezoelectric ceramic layers as thin as 20 to 200 $\mu$m and a plurality of internal electrode layers composed of a metal, which are stacked alternately in order to produce a large displacement with a low voltage.

The internal electrode layers each have an end portion thereof exposed to the side surface of the laminate, and there is the possibility of shorting between the internal electrode layers. Various countermeasures have been taken.

As an example, an organic material is arranged on the side surface of the laminate as an insulating structure. Although an organic material has an insulating effect in a normal air atmosphere, it is not effective in the case where the piezoelectric element is used in a highly humid atmosphere, or in a liquid such as kerosene or gasoline.

In a highly humid atmosphere, the organic material passes moisture, and in the case where a material of Ag group is used for the internal electrode layers, a migration, and hence shorting, occurs (Japanese Unexamined Patent Publication No. 3-12974). Kerosene or gasoline contains water and therefore provides the same problem as a highly humid atmosphere. Further, in the case where the interval between the internal electrode layers is extremely short (say, not more than 100 $\mu$m), a shorting, though not a migration, may occur under a high voltage. This is because the insulation resistance of the piezoelectric element is reduced by moisture absorption. A shorting occurs, therefore, even with the internal electrode layers composed not of Ag but a base metal such as copper or nickel.

In order to prevent the shorting, the piezoelectric element is usually built into a hermetic metal case (in dry air) (hereinafter referred to as the capsule structure). The capsule structure, however, increases the volume of the actuator as a whole and makes it difficult to reduce the size on the one hand and is accompanied with an increased number of parts resulting in an increased cost or a displacement loss. Further, the gap between the capsule and the piezoelectric element deteriorates the heat radiation characteristic.

A method for preventing shorting other than the capsule consists in using two or more layers of organic polymer films for insulation (Japanese Unexamined Patent Publication Nos. 62-88382 and 4-279070). Both of these methods are intended to prevent moisture transmission using an organic material having a high crosslink density on the outside. As far as an organic material is used, however, moisture is transmitted in some way or another, thereby unavoidably leading to shorting.

Still another method is to prevent moisture transmission by forming a metal film on an organic insulating material (Japanese Unexamined Patent Publication No. 2-130970). In the case where the organic insulating material develops cracking, however, a shorting occurs between the metal film and the internal electrode layers of the laminate.

An additional method consists in forming a film by superposing a plurality of inorganic insulating material films (Japanese Unexamined Patent Publication No. 3-155180). Since the inorganic material is hard, however, the displacement due the operation of the laminate cannot be absorbed and a cracks develop. The cracks thus developed allow moisture in. The same patent publication also describes a method in which the displacement is absorbed by an intentionally provided slit. In this method, however, moisture is transmitted by way of the slit in the same manner as through cracking.

SUMMARY OF THE INVENTION

The object of the present invention is to provide a highly reliable, compact, inexpensive piezoelectric element capable of achieving a good heat radiation characteristic without a shorting even in a very humid environment, and an injector using such a piezoelectric element.

According to a first aspect of the invention, there is provided a piezoelectric element comprising:

a ceramic laminate including a plurality of ceramic layers of a piezoelectric ceramic and a plurality of internal electrode layers, the ceramic layers and the internal electrode layers being stacked alternately;

at least an organic insulating layer of an organic material arranged at least on a part of the surface of the ceramic laminate; and at least an inorganic insulating layer of an inorganic material arranged above the organic insulating layer.

The piezoelectric element according to the invention is formed with the organic insulating layer on the surface thereof and an inorganic insulating layer on the organic insulating layer. Therefore, the operating characteristics of the piezoelectric element can be maintained while at the same time preventing moisture intrusion from the outside.

Specifically, the organic insulating layer has an elasticity sufficient to absorb the displacement of the piezoelectric element. Nevertheless, the organic insulating layer cannot positively block the moisture transmission and allows the moisture in.

The inorganic insulating layer, on the other hand, can positively block moisture transmission. The inorganic insulating layer, however, has substantially no elasticity and therefore cannot directly suppress the displacement of the piezoelectric element.

In view of this, according to the invention, the organic insulating layer is arranged directly on the surface of the piezoelectric element, and the inorganic insulating layer is arranged on the organic insulating layer. As a result, any displacement of the piezoelectric element which may occur is absorbed by the elasticity of the organic insulating layer thereby to suppress the effect on the outermost inorganic insulating layer.

Thus, the inorganic insulating layer maintains a superior film state and can thus sufficiently block moisture transmission substantially regardless of the displacement of the piezoelectric element.

In the case where the piezoelectric element having this configuration is exposed to a highly humid environment or a liquid such as a fuel, the coverage of the exposed surface with the organic insulating layer and the inorganic insulating layer makes it possible to block the moisture intrusion into the surface of the piezoelectric element. As a result, the internal electrode layers exposed to the side surface of the piezoelectric element are prevented from being shorted.

As compared with the prior art, the capsule structure for covering the piezoelectric element with another member is not required, thereby leading to a smaller size, a lower cost and a higher heat radiation characteristic of the whole structure of the piezoelectric element.

According to a second aspect of the invention, there is provided an injector so configured that a valve body is opened/closed by use of the displacement of a piezoelectric element thereby to control the fuel injection, wherein the piezoelectric element is built in a fuel path and adapted to operate in a state exposed to the fuel.

The injector according to the invention is so configured that the valve body is opened/closed by the displacement of the piezoelectric element used as an actuator (piezoelectric actuator) as described above. The piezoelectric element is arranged in a state exposed to the fuel in the fuel path in the injector housing. No cover or the like is arranged around the piezoelectric element. As a result, the piezoelectric element can be accommodated in a compact housing, and the size of the injector as a whole can be reduced.

Also, the direct contact between the fuel and the piezoelectric element can improve the radiation of the heat generated by the displacement of the piezoelectric element itself, thereby making it possible to improve the performance of the piezoelectric element.

According to the invention, therefore, a compact, high-performance injector can be provided.

DESCRIPTION OF THE PREFERRED EMBODIMENTS

Figure 1:
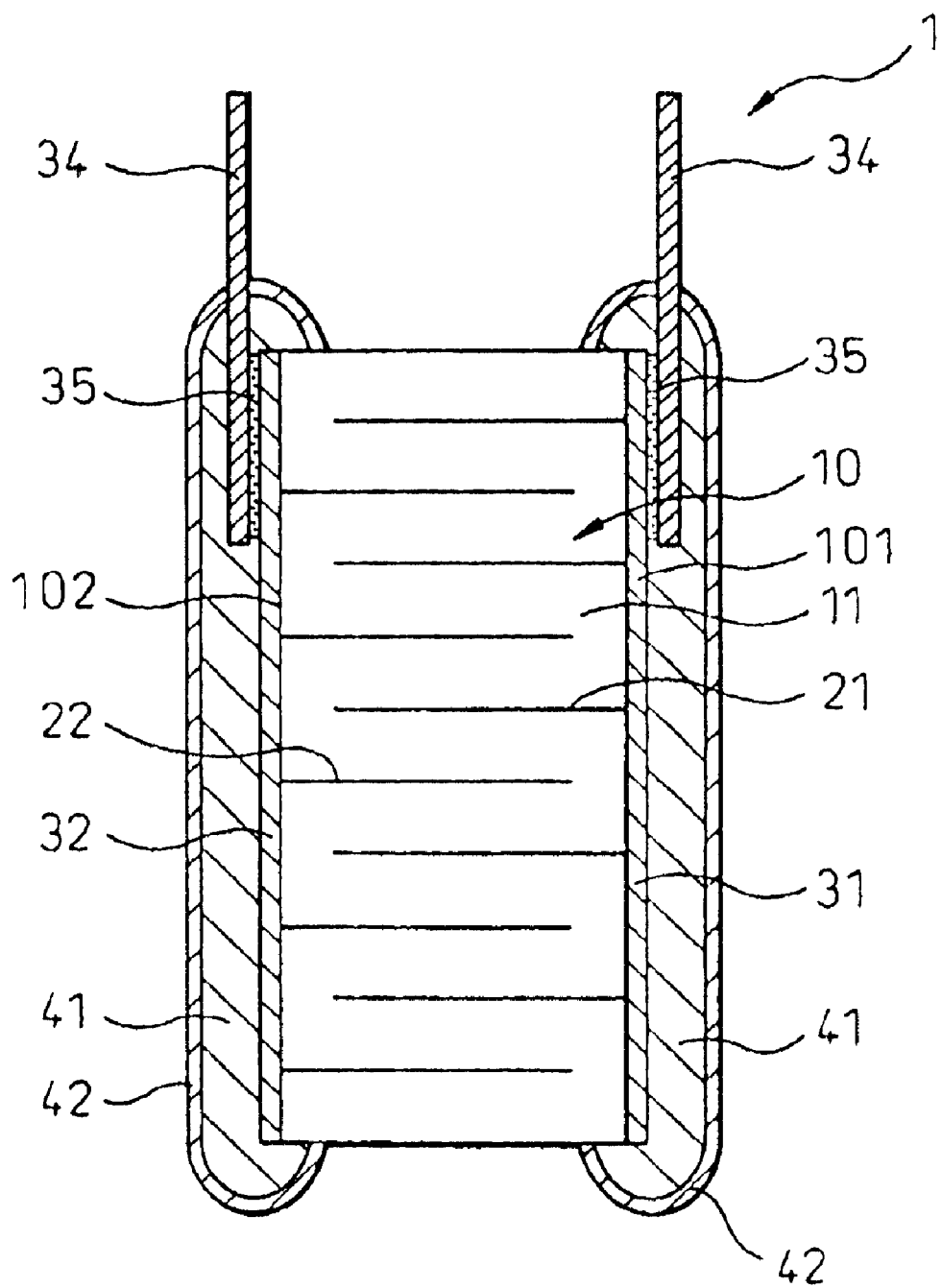
FIG. 1 is a diagram for explaining the structure of a piezoelectric element according to a first embodiment of the invention.

In the first aspect of the invention, the total thickness of the organic insulating layer is preferably not less than 1 $\mu$m, and the total thickness of the inorganic insulating layer is preferably not more than 100 $\mu$m.

In the case where the total thickness of the organic insulating layer is less than 1 $\mu$m, the displacement of the piezoelectric element cannot be easily absorbed. In the case where the thickness of the organic insulating layer is excessively large, on the other hand, a void is created in it and a problem of insulation failure is posed. Thus, the total thickness of the organic insulating layer is preferably not more than 100 $\mu$m.

In the case where the total thickness of the inorganic insulating layer exceeds 100 $\mu$m, cracking is liable to develop due to the film stress created at the time of forming a film (the stress generated by the difference of the coefficient of linear expansion with a base material during the decrease to room temperature after the film is formed at a high temperature). This poses the problem of a reduced resistance against the displacement of the piezoelectric element. More preferably, therefore, the total thickness of the inorganic insulating layer is not more than 30 $\mu$m. For blocking moisture transmission, on the other hand, the total thickness of the inorganic insulating layer is required to be at least not less than 50 nm. As a result, the total thickness of the inorganic insulating layer is preferably in the range of 50 nm to 30 $\mu$m.

The film-forming temperature of the inorganic insulating layer is preferably not higher than 300° C. In the case where the temperature at which the inorganic insulating layer is formed exceeds 300° C., the underlying organic insulating layer may be decomposed. Further, the solder or the conductive adhesive, if any is used with the piezoelectric element, for leading the electrodes may be decomposed. For this reason, the film-forming temperature of the inorganic insulating layer is preferably not more than 300° C.

The inorganic insulating layer is preferably formed by the ALE (atomic layer epitaxy) method.

The profile of the piezoelectric element is very complicated and has a shape such as a pole with a section of square, hexagon, octagon or other polygons, circle, ellipse or barrel. An inorganic insulating layer free of defects such as pinholes must be formed on the piezoelectric element having the very complicated shape described above. The film-forming method of dry type may include sputtering, CVD and vapor deposition, or is classified, according to the film-forming mechanism, into the adsorption method and the deposition method.

With the deposition method, a film having a complicated shape cannot be formed uniformly in a short length of time. A laminate must be rotated or the film-forming steps are required to be repeated a number of times. The adsorption method, in contrast, can form a uniform film even for a complicated shape.

The wet-type film-forming method using plating, etc. is another probable choice. Since the laminate is wetted during the film-forming process, however, a drying step is required after forming the film. Also, a uniform thickness cannot be attained easily for a complicated shape. Among the film-forming methods of dry adsorption type, the present inventors have found that the ALE method is most desirable.

In the ALE method, two or more raw materials (elements or alloys) are supplied alternately, and by taking advantage of the adsorption reaction of the substrate surface and the difference in vapor pressure between the raw-materials and an intended product, a crystal is grown for each one of the atomic or molecular layers. According to the ALE method, pinholes do not develop and a fine film can be formed.

The ordinary ALE method, in which the object to be formed with a film is required to be heated to about 300 to 600° C., has thus far been inapplicable to the piezoelectric element according to this invention. The present inventors have solved this problem by forming a film using a highly reactive material.

Preferably, the inorganic material for the inorganic insulating layer is an oxide, oxynitride, nitride or carbide of TI, Ti, Ta, Sn, Zn, Hf, Si or Cr, or a carbon film. These materials have a low reactivity with water and therefore have a high corrosion resistance. A dense film can be formed by the ALE method.

An organic insulating layer of an organic material is preferably formed over the inorganic insulating layer. The organic material for the organic insulating layer is preferably at least selected one of natural rubber, isoprene, butadiene, silicone, urethane, chloroprene, acryl, isobutylene and fluoro group. As a result, the inorganic insulating layer can be protected by the outermost organic insulating layer and therefore can be prevented from being damaged.

The piezoelectric element described above can be used as a piezoelectric actuator exposed to a fuel by being arranged on the fuel path in the injector.

Specifically, any of the piezoelectric elements built in the injector according to the second aspect of the invention described above can be used.

Consequently, the insulating layer composed of the organic and inorganic insulating materials incorporated in the piezoelectric element sufficiently exhibits the function thereof even when exposed to the fuel in the injector and can thus prevent the shorting between the internal electrode layers.

Also, since no cover or the like is required around the piezoelectric element as described above, the piezoelectric element can be accommodated in a compact housing and the size of the whole injector can be reduced. Further, the ability to radiate the heat generated by the piezoelectric element itself at the time of displacement can be improved by bringing the fuel into direct contact with the piezoelectric element.

First Embodiment

A piezoelectric element according to an embodiment of the invention will be explained with reference to FIGS. 1, 2 and 3a to 3c.

A piezoelectric element 1 according to this embodiment comprises, as shown in FIG. 1, a ceramic laminate 10 including a plurality of ceramic layers 11 of a piezoelectric ceramic and internal electrode layers 21, 22 stacked alternately.

The piezoelectric element 1 further comprises at least an organic insulating layer 41 of an organic material formed on at least a part of the surface of the ceramic laminate 10, and at least an inorganic insulating layer 42 of an inorganic material formed above the organic insulating layer 41.

This configuration will be described in more detail below.

The ceramic laminate 10 of the piezoelectric element 1 is configured, as shown in FIGS. 2 and 3a to 3c, in such a manner that the internal electrode layers 21, 22 are formed to assume alternately positive and negative polarities between the ceramic layers 11. As shown in FIGS. 2 and 3a to 3c, the internal electrode layers 21 are arranged in such a position as to be exposed to one side surface 101, and the internal electrode layers 22 are arranged in such a position as to be exposed to the other side surface 102 of the ceramic laminate 10. The side surfaces 101, 102 of the ceramic laminate 10 are formed with side electrodes 31, 32, respectively, by baking Ag paste, to electrically connect the exposed end portions of the internal electrode layers 21, 22, respectively.

The side electrodes 31, 32 are coupled to external electrodes 34 of SUS as shown in FIG. 1 using a conductive adhesive 35 (containing epoxy resin and 70 wt. % Ag).

Figure 2:
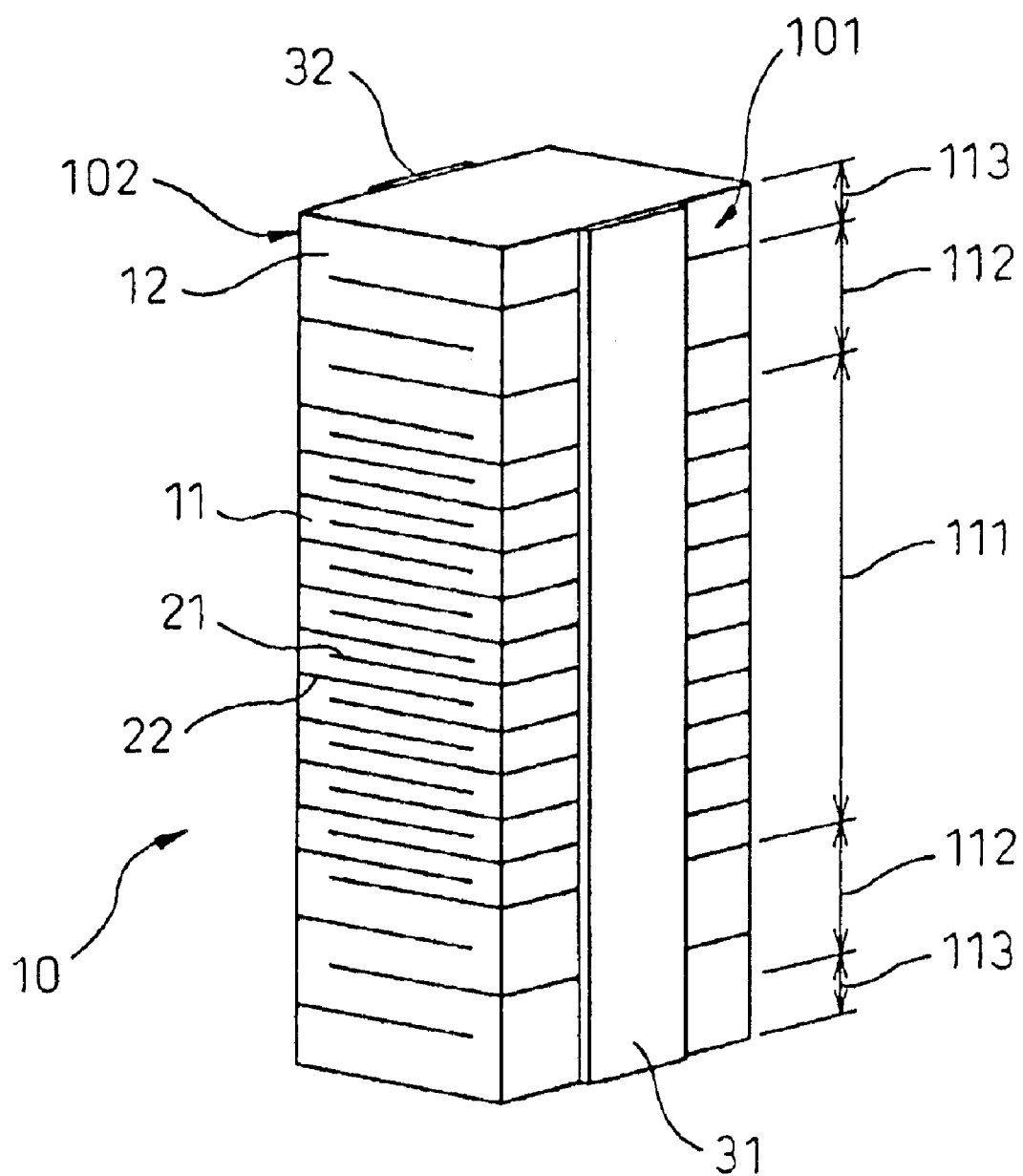
FIG. 2 is a diagram for explaining the structure of a ceramic laminate according to the first embodiment of the invention.

The ceramic laminate 10, as shown in FIG. 2, comprises a drive portion 11 constituting the central portion along the direction of stacking, a pair of buffer portions 112 arranged to sandwich the drive portion 111, and a pair of dummy portions 113 arranged to sandwich the combination of the drive portion 11 and the buffer portions 112. The buffer portions 112 and the dummy portions 113 are not necessarily provided.

The ceramic layers 11 of the ceramic laminate 10 can be fabricated by the green sheet method. According to this embodiment, the composition of the ceramic layers 11 is adjusted to finally constitute a piezoelectric ceramic of what is called the PZT (lead zirconate titanate) group. Nevertheless, a piezoelectric ceramic of another material can also be employed.

The internal electrode layers 21, 22 can be formed by screen printing the paste of silver and palladium on the surface of a green sheet for the ceramic layers. The material of the internal electrode layers 21, 22 may alternatively be any of other conductive materials such as copper, nickel, platinum and silver or a mixture of any of them.

Figure 3A:
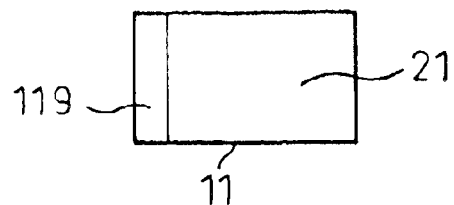
FIGS. 3a to 3c are developments showing the structure of a ceramic laminate according to the first embodiment of the invention.
Figure 3B:
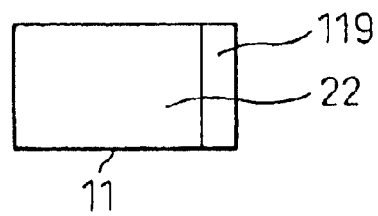
Figure 3C:
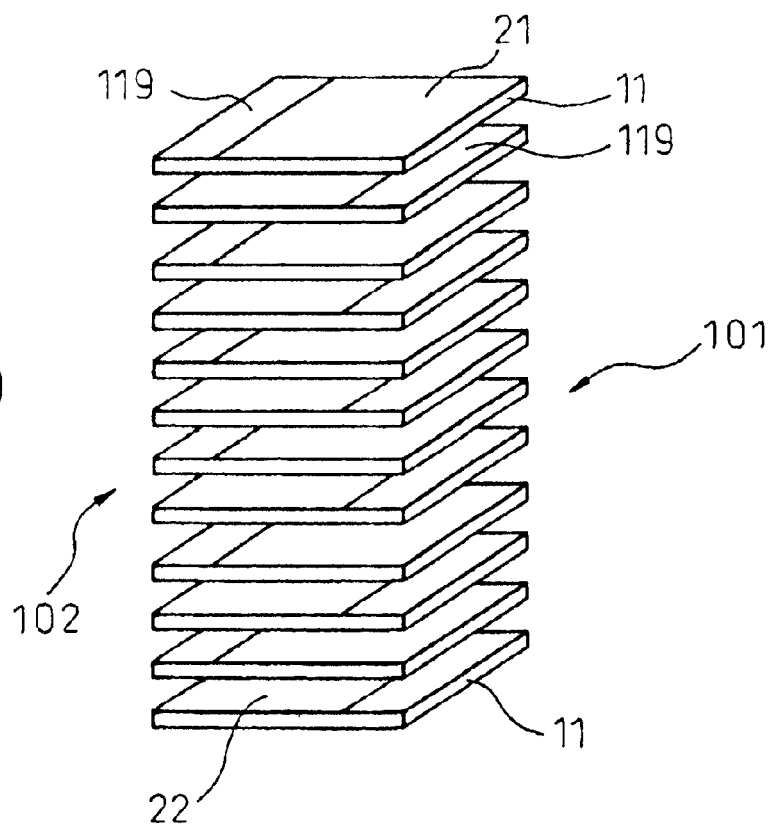

FIGS. 3a to 3c are developments showing a laminate and an example of the green sheets after pattern printing. As shown in FIGS. 3a, 3b, the surface of each ceramic layer 11 is formed with the internal electrode layer 21 or 22 of Ag/Pd paste except at an end portion called a bracing 119 where the ceramic layer 11 is exposed.

The ceramic layers 11 and the internal electrode layers 21, 22 are stacked, as shown in FIG. 3c, with the internal electrode layers 21, 22 staggered in such a manner as to arrange the bracings 119 at the side surfaces 101, 102 alternately.

This embodiment of the invention, which represents a partial electrode structure, is also applicable to a total electrode structure or other electrode structures with equal effect.

The laminate of the ceramic layers 11 and the internal electrode layers 21, 22 is formed into an integrally baked stack-type ceramic laminate 10 through the thermal bonding step, the degreasing step and the baking step.

The side electrodes 31, 32 and the external electrodes 34 are arranged as shown in FIGS. 1 and 2, after which the organic insulating layer 41 is formed over the entire side surface of the ceramic laminate 10, followed by forming the inorganic insulating layer 42 over the assembly. According to this embodiment, silicon resin is used for the organic insulating layer 41.

Specifically, the dipping method is used. The organic insulating layer 41 is not formed at the central portion of the end surfaces along the direction of stacking, but arranged to cover the whole side surface of the ceramic laminate 10. The thickness of the organic insulating layer 41 is set to 80 $\mu$m. Instead of the silicon resin used in this embodiment, polyimide resin, epoxy resin, urethane resin or the like resin can alternatively be used.

In this embodiment, the inorganic insulating layer 42 of 100 nm thick $Al_2O_3$ is formed over the organic insulating layer 41. The inorganic insulating layer 42 is formed by the ALE (atomic layer epitaxy) method.

The ALE method will be briefly explained. A gas of not less than the saturated molecular weight sufficient to be chemically adsorbed to a substrate (corresponding to the organic insulating layer 41 in this embodiment) and a gas of not less than the saturated molecular weight reactive with the first gas are introduced alternately into a reactor to form a film. In order to prevent the reaction in the gas phase (in CVD mode), the interior of the reactor is purged with a gas such as $N_2$ or Ar.

In this embodiment, the film is formed using TMA (trimethyl aluminum) and $H_2O$ gas. TMA has such a characteristic as to strongly react with $H_2O$ even at room temperature, and therefore an $Al_2O_3$ thin film can be formed sufficiently at the substrate temperature of about 100° C. The gas used as an oxidization agent may be other than $H_2O$. The thin film can be formed alternatively using $H_2O_2$, $O_2$ or more active $O_3$, $CH_3OH$, $C_2H_5OH$ or the like alcohol.

According to this embodiment, the film-forming temperature of the inorganic insulating layer 42 is set at a temperature not higher than 300° C. in order not to damage the organic insulating film 42 corresponding to the substrate.

The TMA and $H_2O$ gasified in a bottle at room temperature are each introduced into the reactor using a carrier gas of $N_2$ at the rate of 400 sccm. The $N_2$ gas is used as a purge gas. The introduction time to form a film is 0.6 sec for the gasified TMA, and the purge time is 2.4 sec for TMA, 1.0 sec for gasified $H_2O$ and 4.0 sec for $H_2O$. This process is repeated over 5,000 cycles to form a film.

In the process, the lead frame portion is masked not to form a film. This is in order to couple the wiring at the electrode lead portion in a subsequent process by soldering or the like. The inorganic insulating layer may be removed alternatively in a subsequent process by wet etching or grinding without a mask.

As an inorganic insulating layer, an $Al_xO_yN_z$ film may be formed using the $NH_3$ gas by the ALE method. Several ALE methods are available for adding N to $Al_2O_3$. One is a method of forming an $Al_xO_yN_z$ film in a cycle including the steps of introducing TMA, purging, introducing $H_2O$ and $NH_3$, purging and so forth. Another method consists in forming an $Al_2O_3$ layer and an AlN layer alternately in a cycle including the steps of introducing TMA, purging, introducing $H_2O$, purging, introducing TMA, purging, introducing $NH_3$, purging and so forth. In still another method, a thin laminate film of $Al_2O_3$ plus AlN is formed by repeating the desired number of cycles each including the steps of introducing TMA, purging, introducing $H_2O$ and $NH_3$, purging and so forth, followed by the desired number of cycles each including the steps of introducing TMA, purging, introducing $NH_3$, purging and so forth.

Instead of $Al_2O_3$ used for the inorganic insulating layer 42 according to this embodiment, a material such as AlON, $SiO_2$, $TiO_2$, $Ta_2O_5$, $SnO_2$, ZnO or $ZrO_2$ can be used alternatively. Still another choice is $Si_3N_4$ generally used for a semiconductor device.

Now, the operation and effects of this embodiment will be explained.

The piezoelectric element 1 according to this embodiment comprises the organic insulating layer 41 over the entire side surface thereof and the inorganic insulating layer 42 covered on the layer 41. As a result, the piezoelectric element 1 can block moisture transmission from outside while, at the same time, maintaining the operating characteristics thereof.

Specifically, the organic insulating layer 41 has such an elasticity as to absorb the displacement of the piezoelectric element 1. Nevertheless, the organic insulating layer 41 cannot positively shut off moisture but allows it to pass through. This situation remains the same even if the thickness of the organic insulating layer 41 is increased from 10 μm to, say, 200 μm.

The inorganic insulating layer 42, on the other hand, can positively block moisture transmission. The inorganic insulating layer 42, however, substantially lacks elasticity and therefore cannot directly suppress the displacement of the piezoelectric element 1.

According to this embodiment, as described above, the organic insulating layer 41 is arranged directly over the side surface of the piezoelectric element 1 with the inorganic insulating layer 42 formed thereon. Whenever the piezoelectric element 1 is displaced, therefore, the displacement is absorbed by the elasticity of the organic insulating layer 41 and thereby the effect of the displacement on the outermost inorganic insulating layer 42 can be suppressed.

For this reason, the inorganic insulating layer 42 maintains a superior film condition almost without regard to the displacement of the piezoelectric element 1 and can sufficiently block moisture transmission.

The piezoelectric element 1, when exposed to a high-humidity environment or a liquid such as a fuel, can prevent intrusion of moisture into the side surface of the piezoelectric element 1 due to the presence of the organic insulating layer 41 and the inorganic insulating layer 42. Thus, the internal electrode layers 21, 22 exposed to the side surfaces of the piezoelectric element 1 can be prevented from shorting.

As a result, the conventional capsule structure is eliminated in which the periphery of the piezoelectric element is covered with another material. Thus, the whole structure of the piezoelectric element can be reduced in size for a lower cost and a higher heat radiation capability.

Second Embodiment

This embodiment represents an example of an injector 5 configured so that a valve is operated using the displacement of the piezoelectric element 1 according to the first embodiment thereby to control fuel injection.

Figure 4:
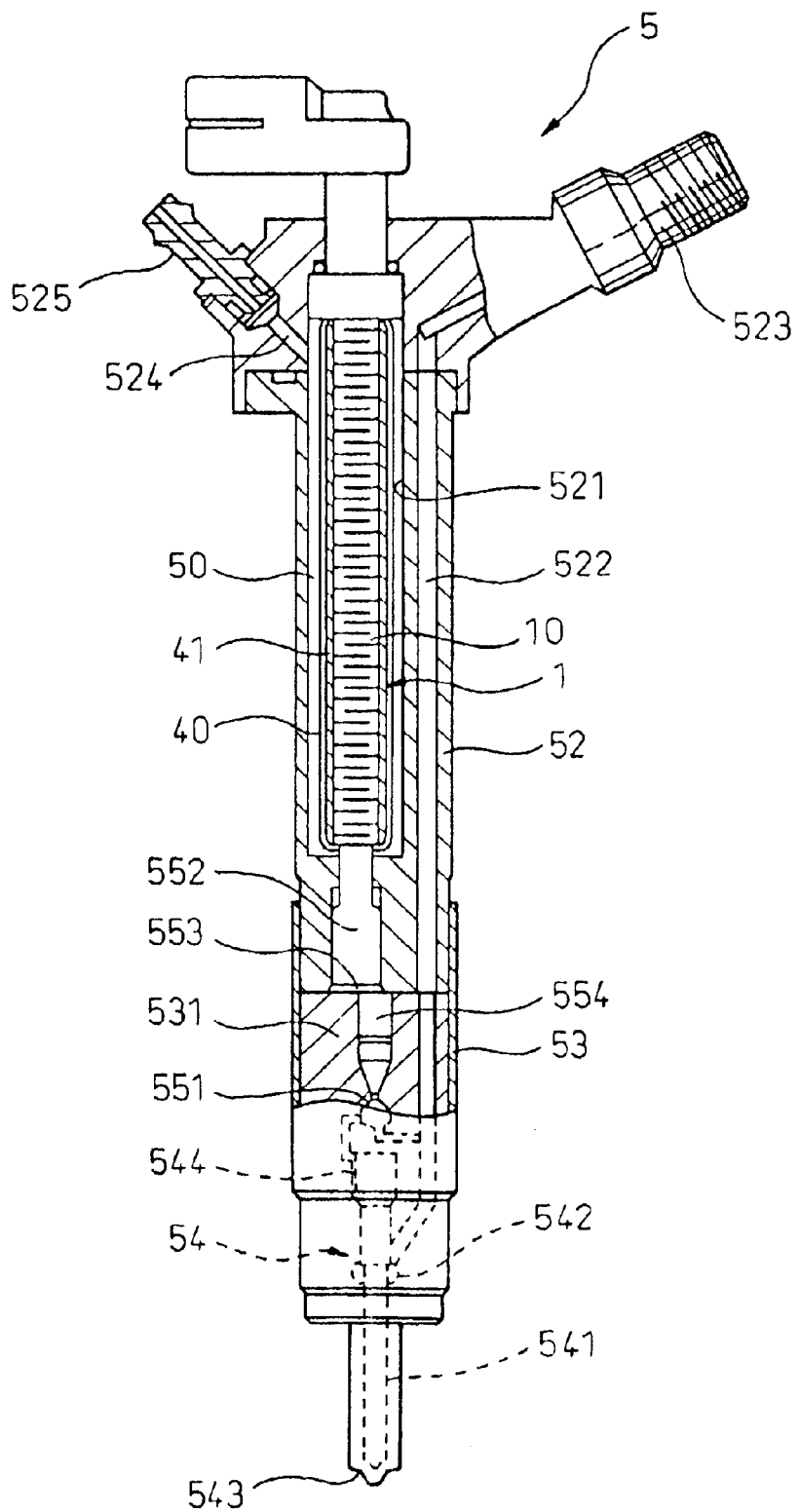
FIG. 4 is a diagram for explaining the structure of an injector according to a second embodiment of the invention.

The injector 5 according to this embodiment is used with a common rail injection system for the diesel engine as shown in FIG. 4.

The injector 5, as shown in FIG. 4, comprises an upper housing 52 for accommodating the piezoelectric element 1 constituting a drive unit, and a lower housing 53 fixed on the lower end of the upper housing 52 and formed with an injection nozzle portion 54 therein.

The upper housing 52 is substantially cylindrical in shape, and has a longitudinal hole 521 eccentric of the center axis thereof through which the piezoelectric element 1 fixedly inserted.

A high-pressure fuel path 522 is arranged in parallel with the side of the longitudinal hole 521. The upper end portion of the fuel path 522 communicates with an external common rail (not shown) through the fuel lead-in pipe 523 projected upward of the upper housing 52.

A fuel lead-out pipe 525 communicating with a drain path 524 is projected upward of the upper housing 52, so that the fuel flowing by way of the fuel lead-out pipe 525 is returned to a fuel tank (not shown).

The drain path 524 passes through a gap 50 between the longitudinal hole 521 and the drive unit (piezoelectric element) 1 and communicates with a three-way valve 551 described later, through a path not shown extending downward through the upper and lower housings 52, 53 from the gap 50.

The injection nozzle 54 includes a nozzle needle 541 adapted to slide vertically in a piston body 531 and an injection hole 543 opened/closed by the nozzle needle 541 for injecting to each engine cylinder a high-pressure fuel supplied from a fuel pool 542. The fuel pool 542 is arranged around the intermediate portion of the nozzle needle 541 and has the lower end portion of the high-pressure fuel path 522 is open to the fuel pool 542. The nozzle needle 541 receives the fuel pressure in such a direction as to open the valve from the fuel pool 542 on the one hand and the fuel pressure in such a direction as to close the valve from the back pressure chamber 544 facing the upper end surface of the nozzle needle 541 on the other hand. When the pressure of the back pressure chamber 544 drops, the nozzle needle 541 is lifted and the injection hole 543 is opened thereby to inject the fuel.

The pressure of the back pressure chamber 544 is changed by a three-way valve 551. The three-way valve 551 is so configured that the back pressure chamber 544 and the high-pressure fuel path 522 or the drain path 524 are rendered to communicate selectively with each other. In this case, the three-way valve 551 has a ball-shaped valve body adapted to open/close a port communicating with the high-pressure fuel path 522 or the drain path 524. This valve body is driven by the drive unit 1 through a large-diameter piston 552, an oil pressure chamber 553 and a small-diameter piston 554 arranged thereunder.

This embodiment employs the piezoelectric element 1 as a drive source for the injector 5 having the configuration described above.

What is important is the fact that the piezoelectric element 1 is arranged in a low-pressure fuel path constituting the vertical hole 521 and operated while being exposed to the fuel. The piezoelectric element 1 has the organic insulating layer 41 and the inorganic insulating layer 42 covering the whole side surface of the ceramic laminate 10 thereof.

With the injector 5 according to this embodiment, therefore, a compact piezoelectric element 1 is realized without any capsule structure as in the prior art, and the size of the injector 5 as a whole can be reduced. The piezoelectric element 1 is arranged exposed to the fuel in the fuel path in the injector 5. Even in the case where the piezoelectric element 1 generates heat as it is repeatedly displaced, therefore, the heat radiation characteristic can be improved by heat transmission to the fuel. As a result, the temperature increase of the piezoelectric element 1 can be suppressed thereby to maintain a high performance.

In fact, no shorting occurs after the piezoelectric element 1 is operated at the atmospheric temperature of 85° C. and humidity of 85% for up to 1000 hours.

As described above, the injector 5 according to this embodiment employs the piezoelectric element 1 having the structure specified in the first embodiment on the one hand and exposes the piezoelectric element 1 directly to the fuel without employing the capsule structure on the other hand. Thus, a compact, high-performance injector is realized.

First Comparison Example

In order to evaluate the superior characteristics of the piezoelectric element 1 according to the first embodiment, a piezoelectric element 9 representing a comparison example having the conventional structure was prepared and compared with the piezoelectric element 1 according to the first embodiment.

Figure 5:
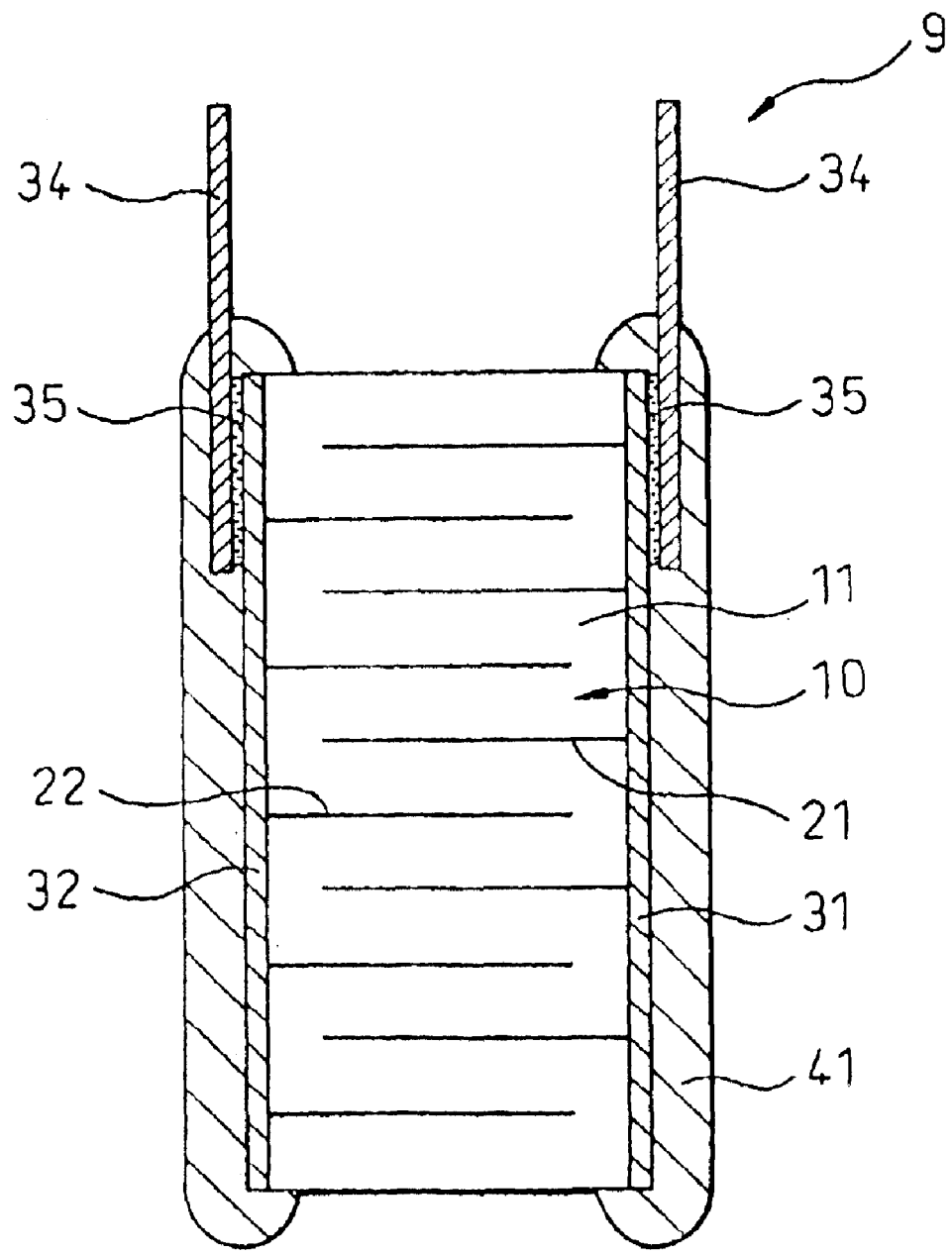
FIG. 5 is a diagram for explaining the structure of a piezoelectric element according to a first comparison example.

The piezoelectric element 9 according to the first comparison example is shown in FIG. 5.

As shown in FIG. 5, the piezoelectric element 9 comprises an organic insulating layer 41 formed over the entire side surface of the ceramic laminate 10 without any outer layer. In other words, the piezoelectric element 9 has a similar structure to the first embodiment except for the absence of the inorganic insulating layer 42.

Figure 6:
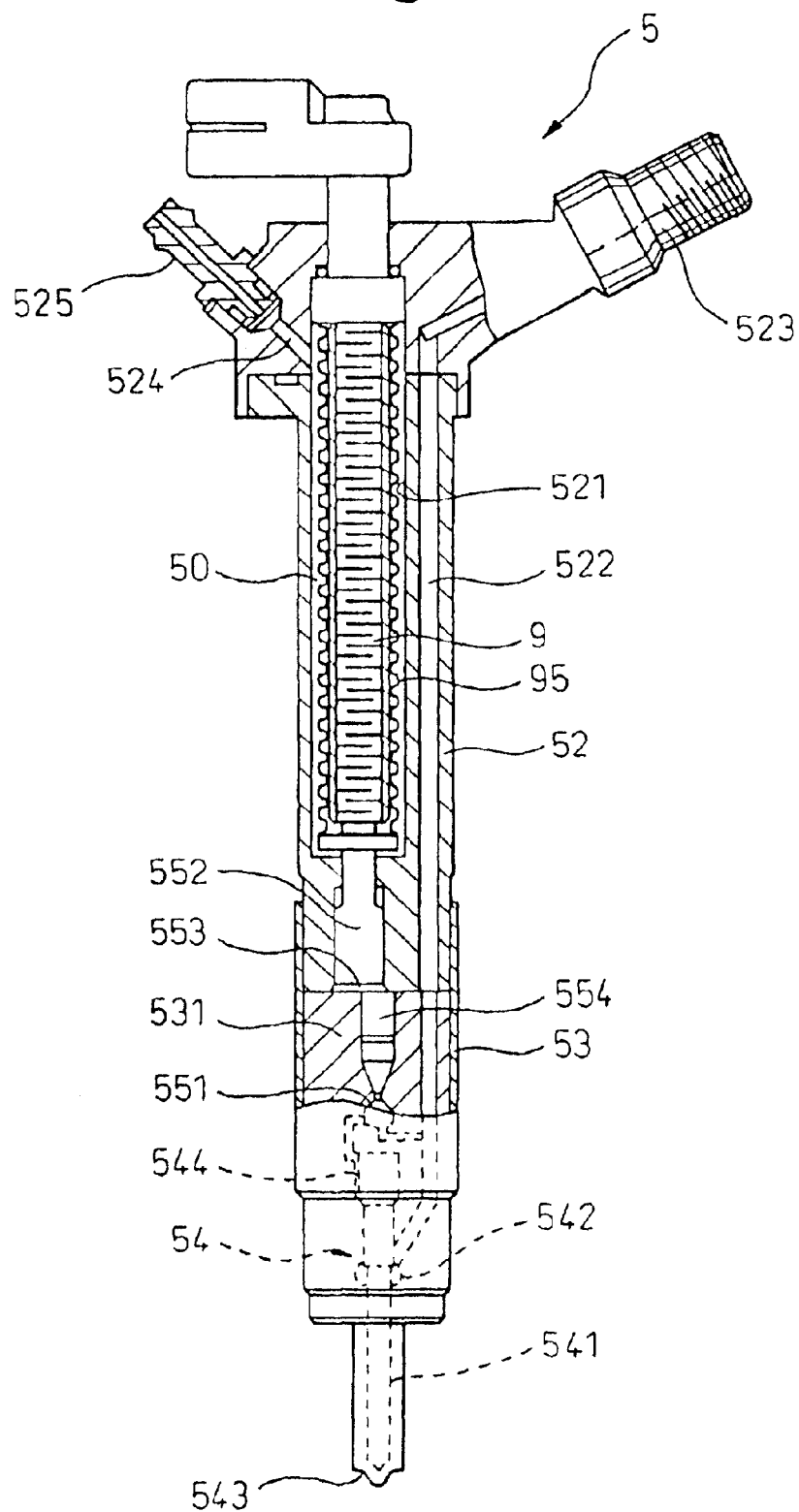
FIG. 6 is a diagram for explaining the structure of an injector according to the first comparison example.

The piezoelectric element 9 (first comparison example), inserted into a bellows-type cover 95 as a capsule structure as shown in FIG. 6, is built in the injector 5 according to the second embodiment. This piezoelectric element 9 is compared with the piezoelectric element 1 according to the second (first) embodiment.

The item of comparison includes the heat value.

Under the same operating conditions, the piezoelectric element 9 (first comparison example) increases by 35° C. in temperature, while the temperature increase of the piezoelectric element 1 (first embodiment) is not more than 5° C.

This indicates that the structure of the piezoelectric element 1 according to the first embodiment is quite superior as an actuator.

Third Embodiment

Figure 7:
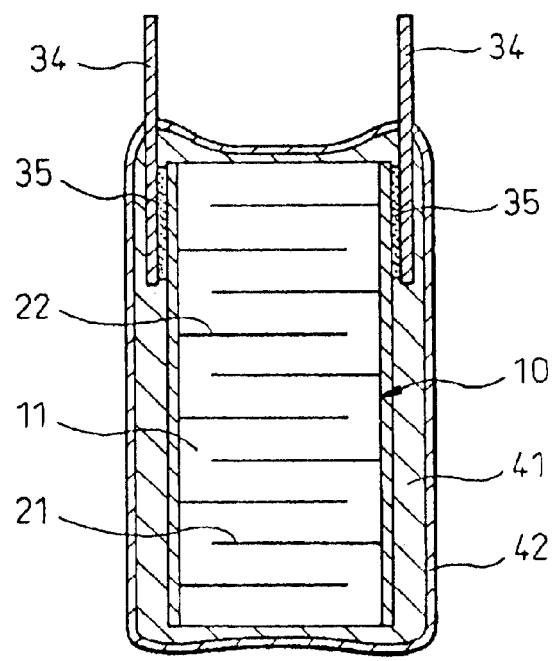
FIG. 7 is a diagram for explaining the structure of a piezoelectric element according to a third embodiment of the invention.

The piezoelectric element 1 according to this embodiment, as shown in FIG. 7, represents a case in which all the surfaces including the end surfaces along the direction of stacking as well as the side surface of the ceramic laminate 10 are covered with the organic insulating layer 41 and the inorganic insulating layer 42. The other points are similar to those of the first embodiment.

In this case, moisture intrusion can be prevented more securely. The other operation and effects are similar to those of the first embodiment.

Fourth Embodiment

Figure 8:
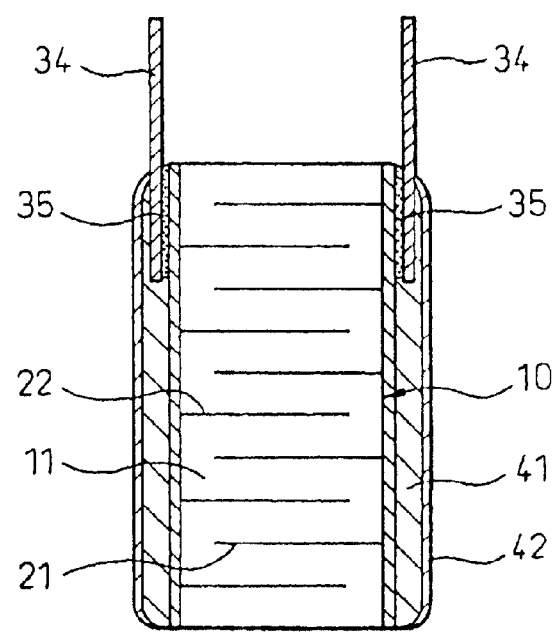
FIG. 8 is a diagram for explaining the structure of a piezoelectric element according to a fourth embodiment of the invention.

The piezoelectric element 1 according to this embodiment, as shown in FIG. 8, represents a case in which the organic insulating layer 41 and the inorganic insulating layer 42 are formed only on the side surface of the laminate, while no insulating layer is formed on the end surfaces along the direction of stacking the laminate. The other points are similar to those of the first embodiment.

In this case, the end surfaces along the stacking direction of the piezoelectric element 1 can be kept flat, and therefore a larger area can be secured for transmitting the displacement force. The other points of operation and effects are similar to those of the first embodiment.

Fifth Embodiment

Figure 9:
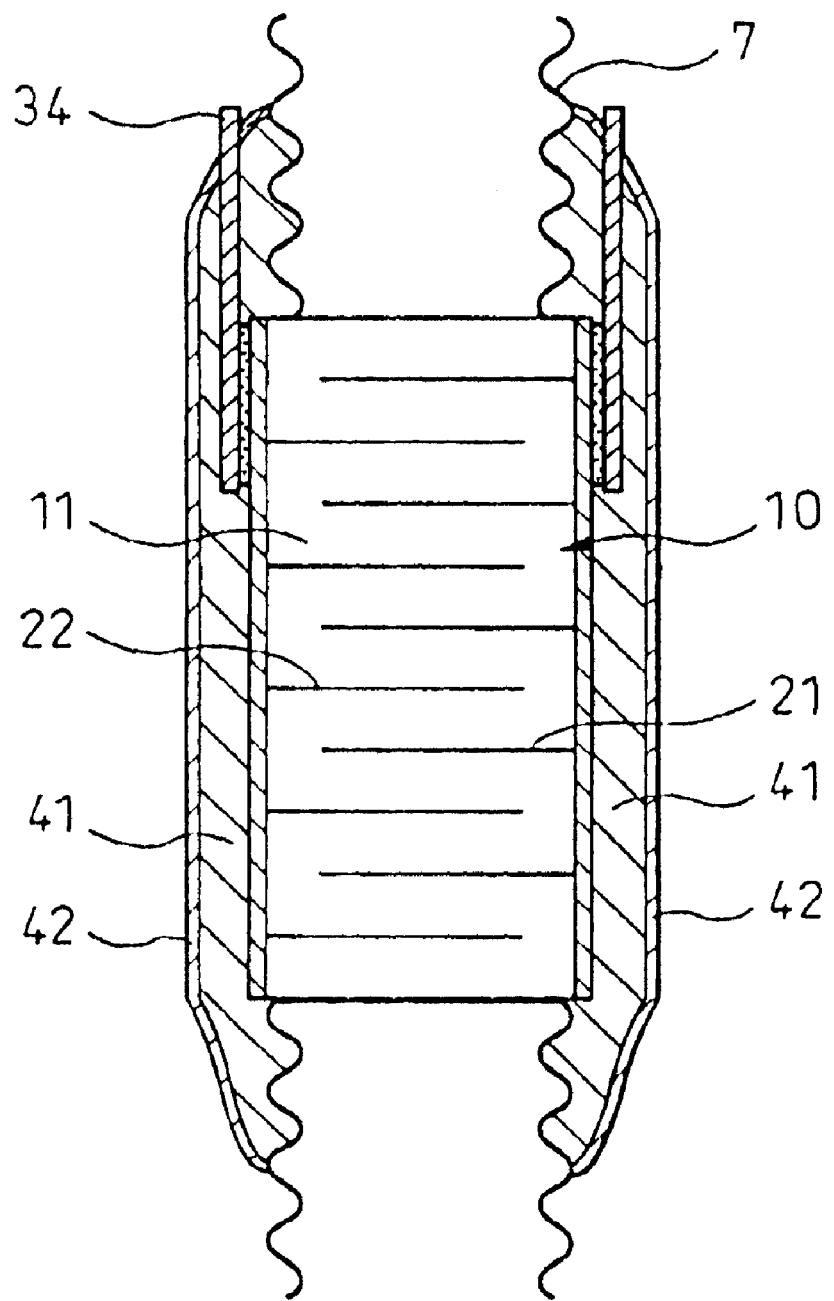
FIG. 9 is a diagram for explaining the structure of a piezoelectric element according to a fifth embodiment of the invention.

In the piezoelectric element 1 according to this embodiment, as shown in FIG. 9, a bellows member 7 is arranged on each of the end surfaces along the direction of stacking of the laminate. The organic insulating layer 41 and the inorganic insulating layer 42 are arranged to such an extent as to cover the base end portion of each bellows member 7. The other points are similar to those of the first embodiment.

In this case, the bellows members 7 can absorb the displacement of the laminate, and therefore the displacement of the organic material and the inorganic material can be suppressed. The other points of operation and effects are similar to those of the first embodiment.

Sixth Embodiment

Figure 10:
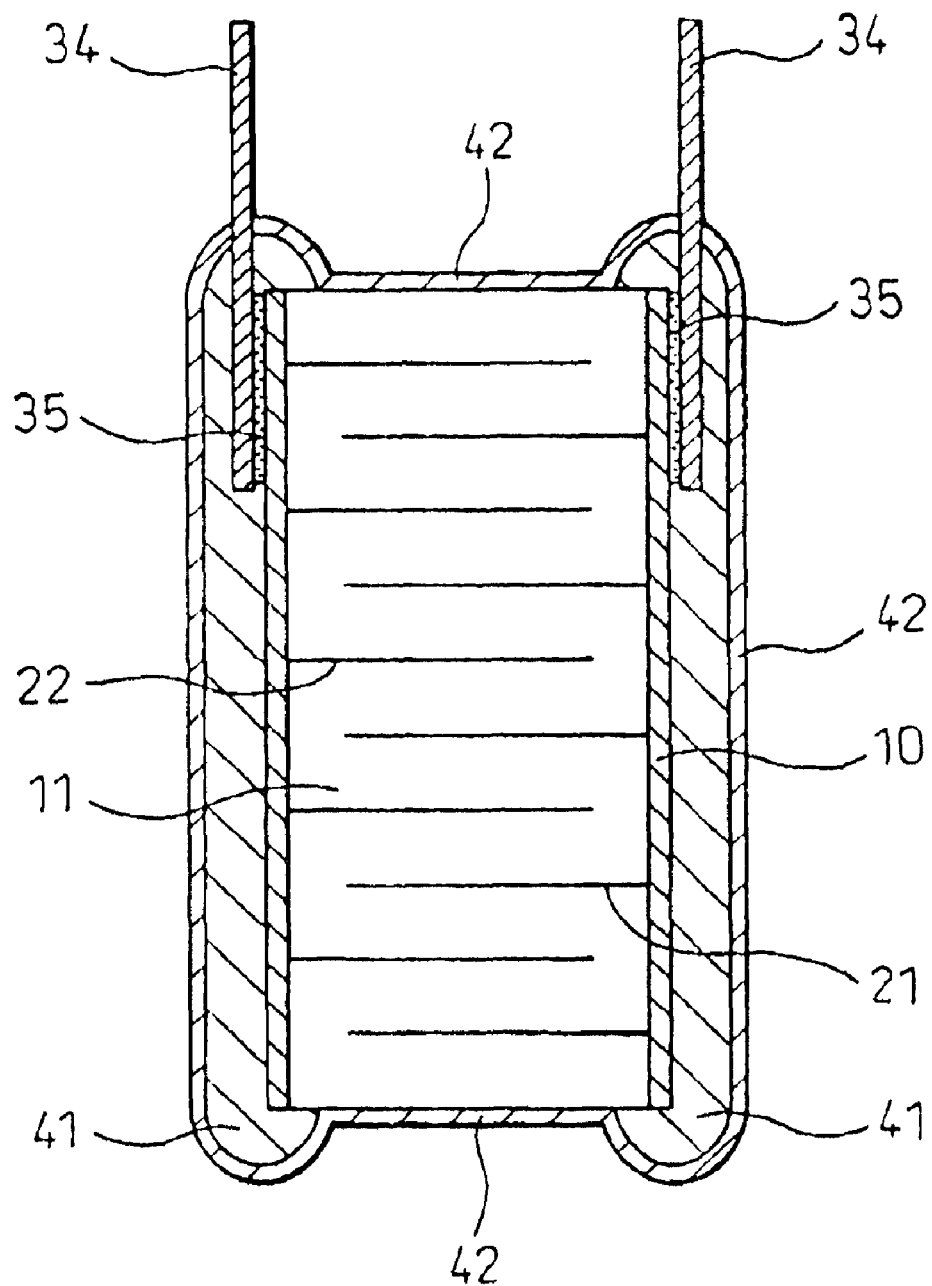
FIG. 10 is a diagram for explaining the structure of a piezoelectric element according to a sixth embodiment of the invention.

According to this embodiment, as shown in FIG. 10, the organic insulating layer 41 is formed only on the side surface of the piezoelectric element 1, while the inorganic insulating layer 42 is formed to cover the organic insulating layer 41.

Specifically, only the inorganic insulating layer 42 is arranged over the whole of the upper and lower surfaces of the piezoelectric element 1, and therefore the humidity resistance of the piezoelectric element can be further improved.

Figure 11:
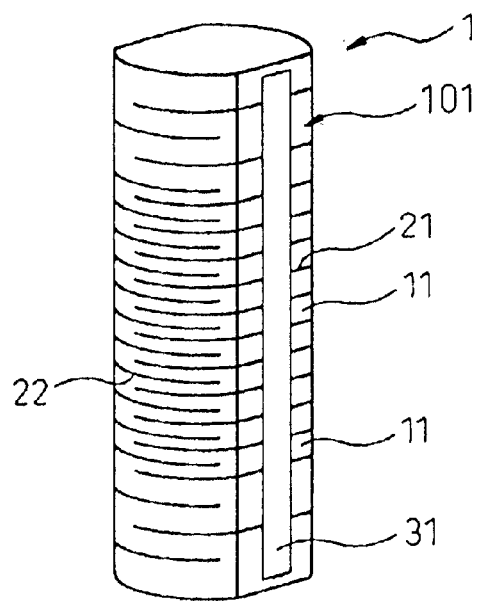
FIG. 11 is a diagram for explaining another example of a ceramic laminate according to each embodiment of the invention.
Figure 12:
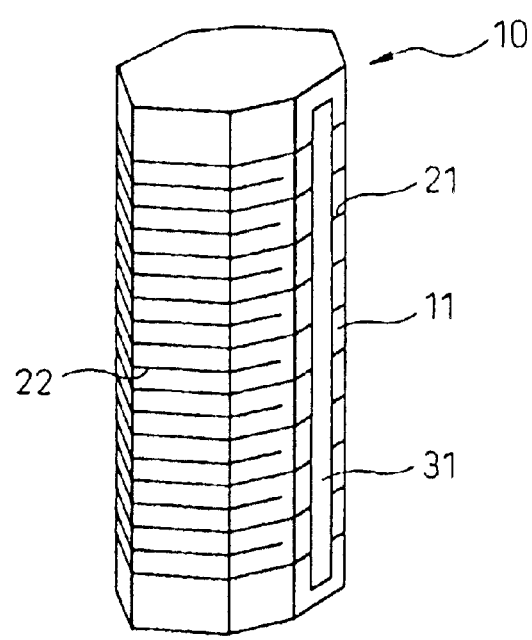
FIG. 12 is a diagram for explaining still another example of a ceramic laminate according to each embodiment of the invention.

Apart from the embodiments described above with reference to a piezoelectric element having a ceramic laminate 10 in the shape of a square pole, similar operation and effects can be achieved with the section of the ceramic laminate 10 in the shape of a barrel as shown in FIG. 11 or in the shape of an octagon or the like as shown in FIG. 12.

What is claimed is:

1. A piezoelectric element comprising:
a ceramic laminate including a plurality of ceramic layers of a piezoelectric ceramic and a plurality of internal electrode layers stacked alternately, wherein the ceramic laminate is disposed for displacement along the stacking direction thereof and has end surfaces in the stacking direction thereof for transmitting said displacement to other parts as operating end surfaces;
at least an organic insulating layer of an organic material formed on at least a part of the surface of said ceramic laminate, wherein the organic insulating layer is formed more thickly on longitudinal side surfaces of the ceramic laminate than on the end surfaces thereof;
and at least an inorganic insulating layer of an inorganic material formed on said organic insulating layer, wherein the inorganic insulating layer covers at least the surface of the organic layer.

2. A piezoelectric element according to claim 1, wherein the total thickness of said organic insulating layer is not less than 1 μm, and the total thickness of said inorganic insulating layer is not more than 100 μm.

3. A piezoelectric element according to claim 2, wherein the total thickness of said inorganic insulating layer is in the range of 50 nm to 30 μm.

4. A piezoelectric element according to claim 1, wherein the film-forming temperature of said inorganic insulating layer is not higher than 300 degree C.

5. A piezoelectric element according to claim 1, wherein said inorganic insulating layer is formed by the ALE (atomic layer epitaxy) method.

6. A piezoelectric element according to claim 1, wherein said inorganic insulating layer is composed of an inorganic material including selected one of the oxides, the oxynitrides, the nitrides and the carbides of Tl, Ti, Ta, Sn, Zn, Hf, Si and Cr, and a carbon film.

7. A piezoelectric element according to claim 1, wherein another organic insulating film of an organic material is formed on said inorganic insulating layer.

8. A piezoelectric element comprising an organic insulating layer composed of an organic material including at least selected one of natural rubber, isoprene, butadiene, silicone, urethane, chroloprene, acryl, isobutylene and a fluoro group.

9. A piezoelectric element according to claim 1, arranged in a fuel path in an injector and used as a piezoelectric actuator exposed to the fuel.

10. A piezoelectric element according to claim 1, wherein the organic insulating layer covers the longitudinal side surfaces of the ceramic laminate and each end surface thereof in the direction of stacking, except a central portion of each end surface which is exposed as an operating end, and the inorganic insulating layer covering the organic insulating layer and not covering said operating ends.

11. A piezoelectric element according to claim 1, wherein the organic insulating layer covers both the longitudinal side surfaces and the end surfaces of the ceramic laminate so that the organic insulating layer is formed more thickly on the longitudinal side surfaces than on the end surfaces, the inorganic insulating layer covering the surface of the organic layer.

12. A piezoelectric element according to claim 1, wherein the organic insulating layer covers solely the longitudinal side surfaces of the ceramic laminate, and the inorganic insulating layer covers the surface of the organic layer and does not cover the end surfaces.

13. A piezoelectric element according to claim 1, wherein a bellow member is further arranged on each end surface of the ceramic laminate, a central portion of each end surface of the ceramic laminate being exposed as operating ends, the organic insulating layer covering the longitudinal side surface of the ceramic laminate and each peripheral end surface of the ceramic laminate, and the inorganic insulating layer covers the organic insulating layer but does not cover the end surfaces.

14. A piezoelectric element according to claim 1, wherein the organic insulating layer covers only the longitudinal side surfaces of the ceramic laminate and each peripheral end surface of the ceramic laminate, and the inorganic insulating layer covers the organic insulating layer and the end surfaces.

* * * * *